US008283243B2

(12) United States Patent
Hébert

(10) Patent No.: US 8,283,243 B2
(45) Date of Patent: Oct. 9, 2012

(54) BOTTOM ANODE SCHOTTKY DIODE STRUCTURE AND METHOD

(75) Inventor: François Hébert, San Mateo, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 13/135,371

(22) Filed: Jun. 30, 2011

(65) Prior Publication Data

US 2011/0287616 A1 Nov. 24, 2011

Related U.S. Application Data

(62) Division of application No. 12/653,345, filed on Dec. 11, 2009, now Pat. No. 8,044,486, which is a division of application No. 11/880,497, filed on Jul. 22, 2007, now Pat. No. 7,633,135.

(51) Int. Cl.
*H01L 21/28* (2006.01)

(52) U.S. Cl. ......... 438/570; 438/167; 438/179; 438/571

(58) Field of Classification Search ................... 438/167, 438/179, 180, 181, 184, 185, 570, 571, 573
See application file for complete search history.

(56) References Cited

U.S. PATENT DOCUMENTS

| | | | | | |
|---|---|---|---|---|---|
| 5,338,964 | A | * | 8/1994 | Bernier | 257/476 |
| 6,051,850 | A | * | 4/2000 | Park | 257/133 |
| 6,075,276 | A | * | 6/2000 | Kitamura | 257/481 |
| 6,784,489 | B1 | * | 8/2004 | Menegoli | 257/343 |
| 6,852,578 | B2 | * | 2/2005 | Chang | 438/167 |
| 7,183,575 | B2 | * | 2/2007 | Shimoida et al. | 257/77 |
| 7,608,907 | B2 | * | 10/2009 | Mallikarjunaswamy | 257/476 |
| 7,719,025 | B2 | * | 5/2010 | Chen et al. | 257/173 |
| 7,777,257 | B2 | * | 8/2010 | Khemka et al. | 257/281 |
| 2005/0269658 | A1 | * | 12/2005 | Ku et al. | 257/471 |
| 2007/0045765 | A1 | * | 3/2007 | Brar et al. | 257/481 |
| 2007/0164310 | A1 | * | 7/2007 | Kwon | 257/173 |
| 2008/0299751 | A1 | * | 12/2008 | Quddus et al. | 438/571 |

* cited by examiner

*Primary Examiner* — Kevin M Picardat
(74) *Attorney, Agent, or Firm* — Bo-In Lin

(57) ABSTRACT

This invention discloses a bottom-anode Schottky (BAS) diode that includes an anode electrode disposed on a bottom surface of a semiconductor substrate. The bottom-anode Schottky diode further includes a sinker dopant region disposed at a depth in the semiconductor substrate extending substantially to the anode electrode disposed on the bottom surface of the semiconductor and the sinker dopant region covered by a buried Schottky barrier metal functioning as a Schottky anode. The BAS diode further includes a lateral cathode region extended laterally from a cathode electrode near a top surface of the semiconductor substrate opposite the Schottky barrier metal wherein the lateral cathode region doped with an opposite dopant from the sinker dopant region and interfacing the sinker dopant region whereby a current path is formed from the cathode electrode to the anode electrode through the lateral cathode region and the sinker dopant region in applying a forward bias voltage and the sinker dopant region depleting the cathode region in applying a reverse bias voltage for blocking a leakage current.

5 Claims, 19 Drawing Sheets

BOTTOM ANODE SCHOTTKY DIODE STRUCTURE AND METHOD

This patent application is a Divisional application and claims the Priority Date of application Ser. No. 12/653,345 filed on Dec. 11, 2009 now U.S. Pat. No. 8,044,486 and application Ser. No. 11/880,497 filed on Jul. 22, 2007 now issued as U.S. Pat. No. 7,633,135 wherein the application Ser. No. 12/653,345 is a Divisional Application of application Ser. No. 11/880,497 filed by common Inventors of this Application. The Disclosures made in the patent application Ser. Nos. 11/880,487 and 12/653,345 are hereby incorporated by reference.

BACKGROUND OF THE INVENTION

1. Field of the Invention

The invention relates generally to the Schottky diode devices. More particularly, this invention relates to a device configuration and method of manufacturing Schottky diodes with a bottom-anode for multiple applications.

2. Description of the Prior Art

Conventional Schottky diodes with a vertical structure that has the cathode disposed at the bottom of a substrate are limited by several difficulties of applications. As a high voltage bias is applied to the substrate, the vertical Schottky diodes with cathode at the bottom of the substrate are not compatible with some assembly configurations. Furthermore, for high voltage devices, such device configuration requires an electrical isolation of the heat sink where the die is mounted, which causes limitations on heat dissipation and adds to complications to system designs when the vertical Schottky diodes are provided with the cathode disposed at the bottom of a substrate. Different types of vertical Schottky diodes have been disclosed. FIG. 1A shows a cross sectional view of a junction barrier Schottky diode formed on the top of a substrate and FIG. 1B shows an alternate Schottky diode implemented as a trench MOS-barrier Schottky diode on the top of a substrate. In either of the Schottky diodes, the Schottky barrier regions are shielded off laterally by depletion of the PN junctions or the MOS trenches when reverse bias reach a certain high voltage to reduce the leakage current. FIGS. 1C and 1D show alternate junction barrier Schottky (JBS) diodes in U.S. Pat. No. 4,134,123 with the P+ regions pinching off the drain from the top anode region. However, the Schottky diodes with a vertical configuration and the cathode on the bottom as shown in these disclosures are still limited by the difficulties discussed above for some practical applications, especially when applied to portable devices that require small package with multi functions to reduce component count and space. Specifically, for power boost converter application as showed in FIG. 1E, the anode of a Schottky diode is connected to the Drain of a MOSFET, which is usually at the bottom of the MOSFET die. It is desirable to co-package the Schottky diode into the MOSFET package to reduce anode parasitic inductance; it is necessary to have two separate die pads for mounting the MOSFET and the Schottky separately. This increases the assembly complexity and cost.

Therefore, a need still exists in the art of device design and manufacture of Schottky diodes by leveraging existing Schottky contact metallization schemes to provide new device configurations and manufacturing method for new and improved Schottky diodes with anode on the bottom of the substrate such that the above discussed problems and limitations can be resolved.

SUMMARY OF THE PRESENT INVENTION

It is therefore an aspect of the present invention to provide a new and improved bottom-anode Schottky (BAS) diode implemented with a combined anode-sinker connected to the bottom of the substrate and a buried Schottky contact. The device configuration has a reduced cell pitch and a planar diode with an N-cathode channel interconnected between the anode-sinker region and a cathode contact. This structure is compatible with many foundries for reducing fabrication costs such that the above discussed technical difficulties and limitations can be overcome.

Specifically, it is an aspect of the present invention to provide improved bottom-anode Schottky diode device for a boost converter application implemented with a combined anode-sinker connected through a cathode region to a cathode contact along a lateral direction such that a bottom anode connection through the anode sinker significantly reduces the anode inductance, and the use of a substrate source contact minimizes source resistance, and such that the Schottky diodes may be suitable for high gain and high frequency applications.

It is another aspect of the present invention to provide improved bottom-anode Schottky diode device implemented with a combined anode-sinker connected through a cathode region to a cathode contact along a lateral direction such that the cell pitch can be reduced and the specific on resistance (Rsp) is minimized for a given operating voltage to achieve low forward voltage drop.

It is another aspect of the present invention to provide improved bottom-anode Schottky diode device implemented with a combined anode-sinker connected through a cathode region to a cathode contact along a lateral direction such that low reverse leakage and high breakdown voltage are achieved.

It is another aspect of the present invention to provide improved bottom-anode Schottky diode device implemented with a combined anode-sinker connected through a cathode region to a cathode contact along a lateral direction such that the BAS diodes are scalable and may be compatible with high and low voltage applications.

It is another aspect of the present invention to provide improved bottom-anode Schottky diode device implemented with a combined anode-sinker connected through a cathode region to a cathode contact along a lateral direction such that the BAS diode devices are rugged because the possibility of latch-up is reduced with distributed body contact and reduced hot carrier injection and the peak voltage generated away from oxide layers.

It is another aspect of the present invention to provide improved bottom-anode Schottky diode device implemented with a combined anode-sinker connected through a cathode region to a cathode contact along a lateral direction such that the BAS diode devices have low leakage through a shielding scheme which extends under the Schottky contact, to completely pinch-off the cathode-region and Schottky contact region, at elevated cathode voltages.

Briefly in a preferred embodiment this invention discloses a bottom-anode Schottky (BAS) diode that includes an anode electrode disposed on a bottom surface of a semiconductor substrate. The bottom-anode Schottky diode further includes an anode to substrate connection formed by a sinker dopant region disposed at a depth in the semiconductor substrate extending substantially to the anode electrode disposed on the bottom surface of the semiconductor and the sinker dopant region covered by a buried Schottky barrier metal functioning as an Schottky anode. The BAS diode further includes a lateral cathode region extended laterally from a cathode electrode near a top surface of the semiconductor substrate opposite the Schottky barrier metal wherein the lateral cathode region doped with an opposite dopant from the sinker dopant region and interfacing the sinker dopant region whereby a current path is formed between the cathode electrode and the anode electrode through the lateral cathode region and the sinker dopant region connected by a Schottky contact in applying a forward bias voltage and the sinker dopant region depleting the cathode region in applying a reverse bias voltage for blocking a leakage current. In an exemplary embodiment, the semiconductor substrate is a P-type substrate and the sinker dopant region is a P-type doped region and the cathode region is a N-type doped region. In another exemplary embodiment, the cathode region laterally extended to the sinker dopant region having a graded dopant profile near the buried Schottky barrier layer for providing a reduced diode resistance. In another exemplary embodiment, the cathode region further includes a cathode contact dopant region doped with a higher dopant concentration for contacting cathode barrier metal covering the cathode contact dopant region. In another exemplary embodiment, the BAS diode further includes a field oxide layer covering the cathode region insulating the buried Schottky barrier metal from the cathode region. In another exemplary embodiment, the BAS diode further includes a field oxide layer covering the cathode region insulating the buried Schottky barrier metal from the cathode region. The buried Schottky barrier metal extends over the top surface of the field oxide to function as a field plate. In another exemplary embodiment, the BAS diode further includes a field oxide layer covering the cathode region insulating the buried Schottky barrier metal from the cathode region; and the buried Schottky barrier metal aligned and cutoff at an end surface of the field oxide layer whereby enabling a self-alignment manufacturing process. In another exemplary embodiment, the BAS diode further includes a field oxide layer covering the cathode region insulating the buried Schottky barrier metal from the cathode region and a BPSG passivation layer covering a buried Schottky barrier metal and the field oxide layer. In another exemplary embodiment, the BAS diode further includes a cathode metal disposed on top of the BAS diode electrically contacting the cathode region to function as the cathode electrode. In another exemplary embodiment, the BAS diode further includes a field oxide layer covering the cathode region insulating the buried Schottky barrier metal from the cathode region and a polysilicon field plate covered with an oxide layer covering over the field oxide layer. In another exemplary embodiment, the semiconductor substrate is a P-type substrate supporting a P-type epitaxial layer thereon the sinker dopant region is a P-type doped region extending from the epitaxial layer to the bottom surface of the P-type substrate.

Furthermore, this invention discloses a method for manufacturing a quasi-vertical diode on a semiconductor substrate that includes a top electrode and a bottom-electrode. The method includes a step of forming a laterally extended doped region in the semiconductor substrate to function as a lateral current-path region for conducting a current between the top and bottom electrodes of the diode. The method further includes a step of forming a sinker doped-region at a depth in the semiconductor substrate, interfacing with the lateral path region to extend vertically to a one of the top or bottom surface of the diode to function as a vertical current path. In another exemplary embodiment, the method further includes a step of electrically connecting the lateral current path region to one of the top or bottom electrodes. In another exemplary embodiment, the step of forming the sinker doped region at a depth in the semiconductor substrate includes a step of forming the sinker doped region as a vertical current path extending to the bottom electrode, and the step of forming the lateral current path region further includes a step of connecting the laterally current path region to the top electrode. In another exemplary embodiment, the method of manufacturing the quasi-vertical diode further includes a step of manufacturing a bottom-anode Schottky (BAS) diode by forming the bottom electrode as a bottom anode electrode.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 1A:
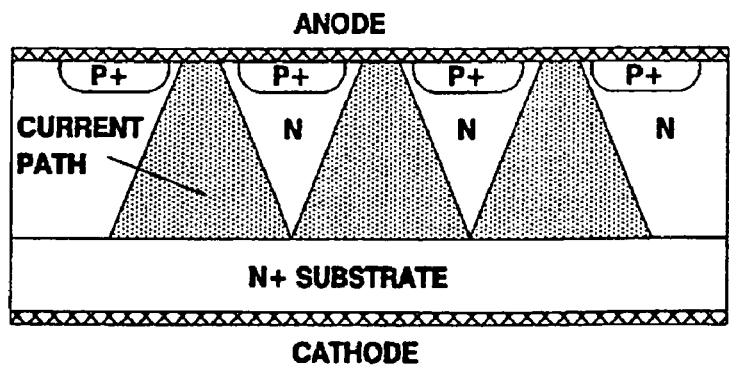
FIGS. 1A and 1B are cross sectional views for showing the typical junction barrier Schottky (JBS) diodes and trench MOS barrier Schottky (TMBS) of the conventional Schottky diodes.
Figure 1B:
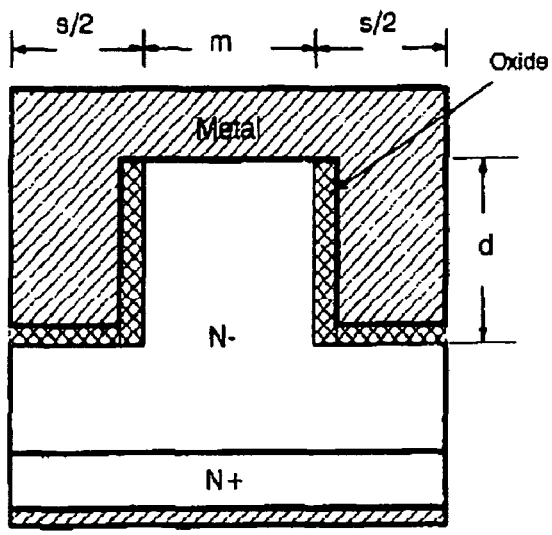
Figure 1C:
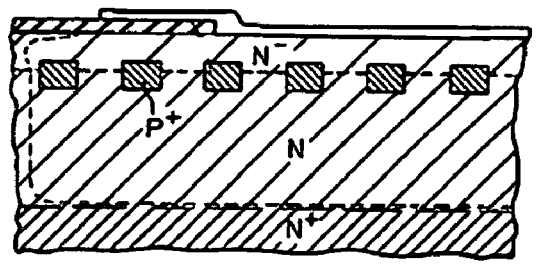
FIGS. 1C and 1D are cross sectional views of Junction Barrier Schottky diodes with top anode configuration.
Figure 1D:
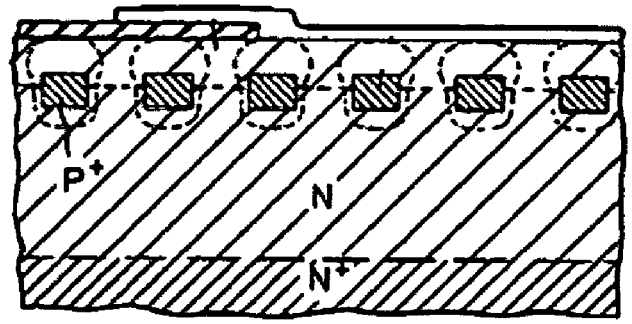
Figure 1E:
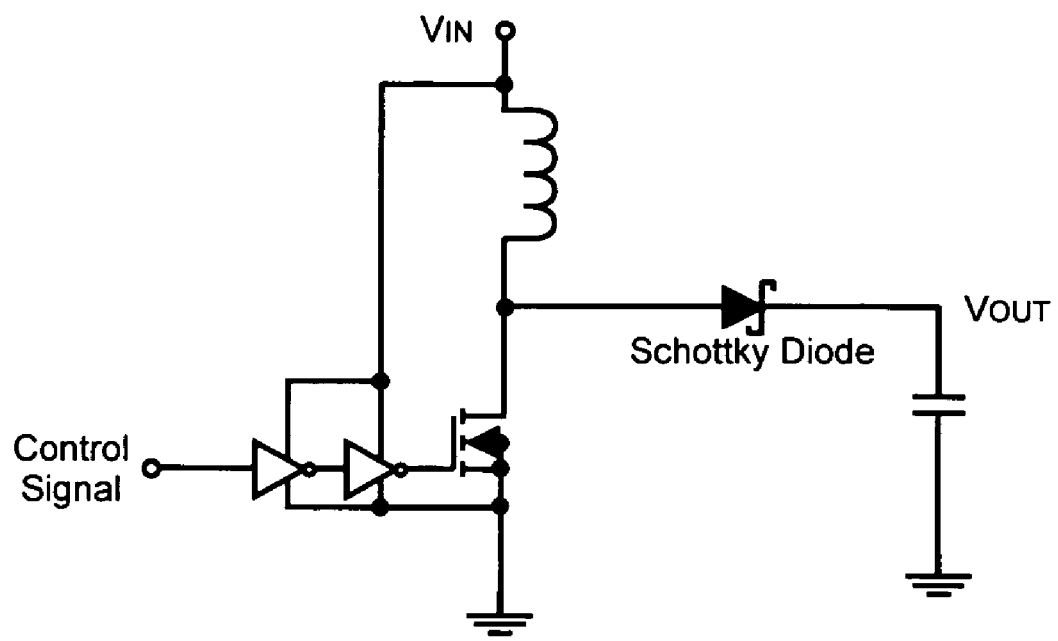
FIG. 1E is a circuit diagram of a high voltage boost converter for portable application.
Figure 2:
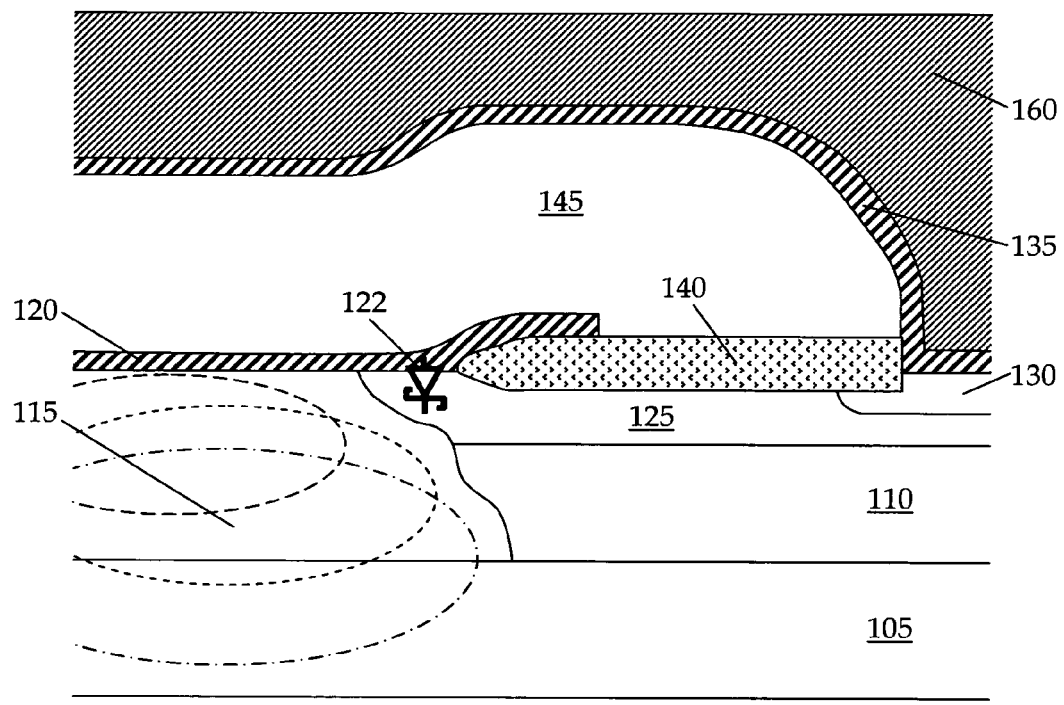
FIG. 2 is a cross sectional view of a bottom anode Schottky (BAS) diode as a first embodiment of this invention.

Referring to FIG. 2 for a cross sectional view of a bottom anode Schottky (BAS) diode device of this invention. The BAS diode device is supported on a P++ substrate 105 functioning as a bottom anode electrode. A layer of P− epitaxial layer 110 is supported on top of the substrate 105. A deep sinker region 115 doped with P+ dopant is disposed below a Schottky barrier metal layer 120, forming an Ohmic contact with Schottky barrier metal 120 and vertically extending to the P++ substrate 105 therefore electrically connecting the substrate bottom metal (not shown) to Schottky barrier metal 120. The Schottky barrier metal 120 extends over a N region 125 forming a Schottky contact (diode) 122 at the interface whereby the N region 125 functions as the Cathode and the Schottky metal layer 120 functions as the Anode of the Schottky diode. An anode to substrate connection is therefore established by the P+ sinker contact electrically with the overlaying Schottky barrier metal 120 and extending to the P+ substrate. The N region 125 may be graded doped to achieve low doping where the Schottky contact is located without increasing resistance. The deep sinker region 115 has an increasing lateral dimension downwards at least to a depth that is deeper than the depth of N region 125 and is further laterally contacting the N-cathode region 125 that extends laterally with a N+ cathode contact region 130 covered by an optional barrier metal 135 with field oxide layer 140 covering over the N− cathode region between the Schottky contact 122 and the cathode contact region 130 therefore insulating the barrier metal 135 from the buried Schottky contact metal 120. A BPSG passivation layer 145 covers the buried Schottky contact layer 120 and the field oxide layer 140. A cathode metal 160 is formed on top of the barrier metal layer 135. Alternatively, the cathode metal 160 may directly contact cathode contact region 130 without the barrier metal layer 135.

When the Schottky diode is forward bias, the bottom anode has a higher voltage and the cathode metal is applied with a lower voltage. Electrons flows from the cathode metal 160 to N+ cathode contact region 130 then laterally to N cathode region 125. The electrons go through the Schottky diode 122 to Schottky metal 120 and then vertically down to the anode electrode (not shown) at the bottom of substrate through P+ sinker region 115. In reversed bias, the deep P+ sinker extending laterally under the Schottky contact pinch-off the N cathode region due to the depletion of the PN junction where P+ sinker in contact with N cathode region therefore block the flow of leakage current. Compare to prior art JBS style diodes, where the p+ diffusions only provide lateral pinch-off in the BAS structure of this invention, the pinch-off starts under the Schottky contact due to the use of high energy deep implants.

Figure 3A:
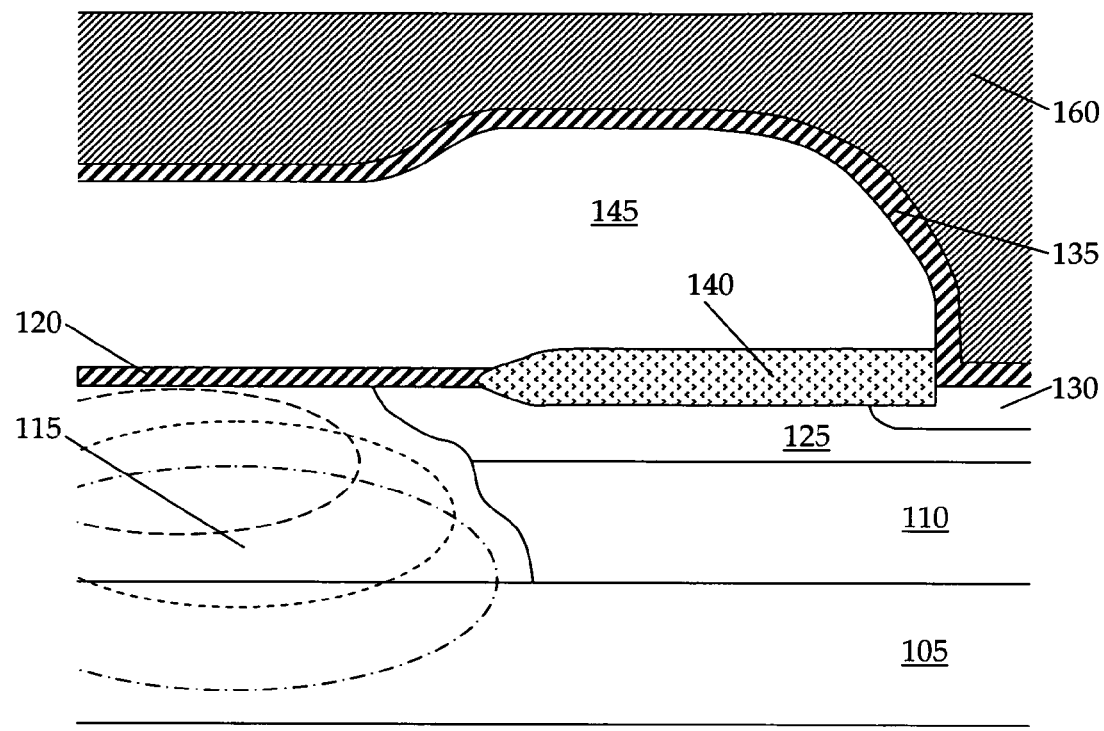
FIG. 3 is a cross sectional view of another BAS diode as another embodiment of this invention.
Figure 3B:
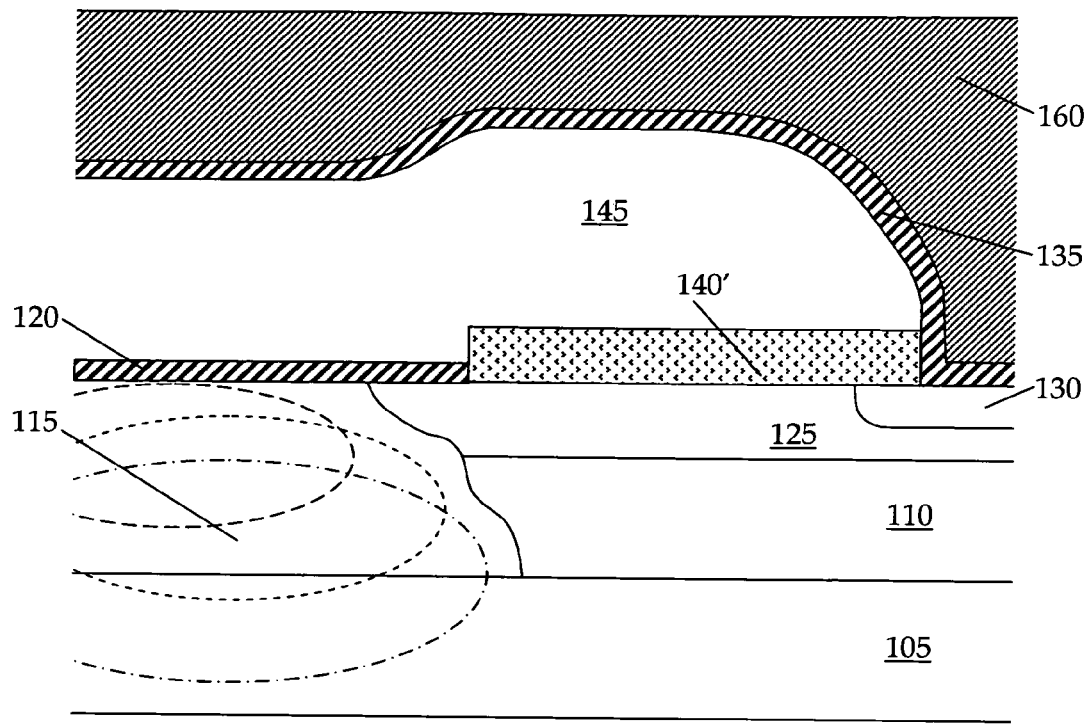
Figure 3C:
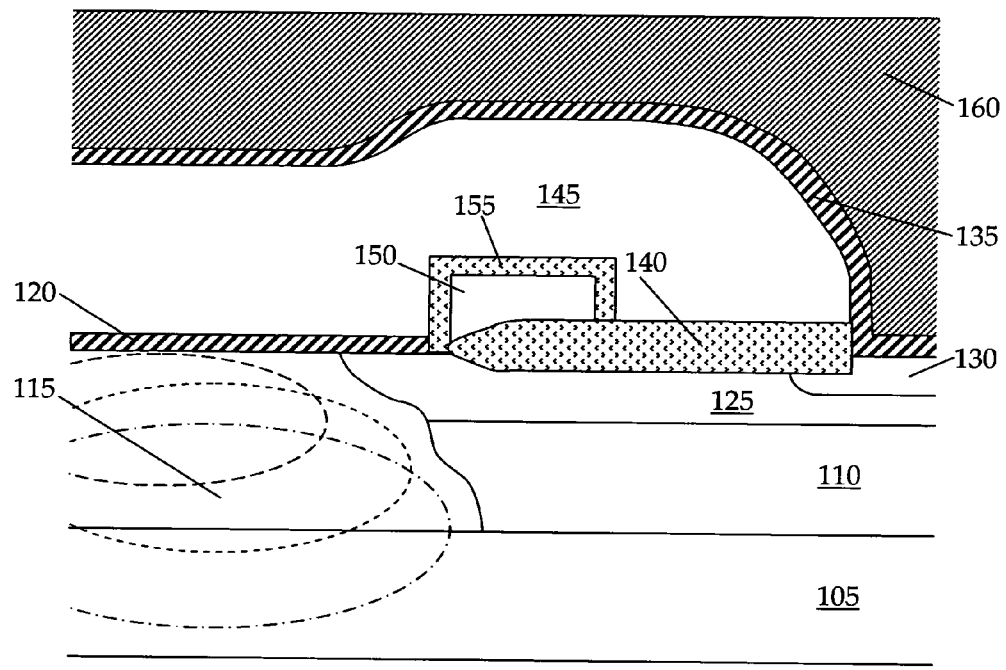

In FIG. 2 the Schottky metal 120 overlaps a portion of field oxide layer 140 forming an Schottky metal field plate that reduces the electric field stress nearby the Schottky metal and field oxide interface therefore improve the device breakdown voltage. FIG. 3A shows an alternate embodiment of a BAS diode similar to the BAS diode of FIG. 2 except that the alternate BAS diode has a Schottky barrier layer 120 self aligned to field oxide 140 therefore reduces one mask in manufacturing process. In this case the layer of field oxide 140 may be replaced by an oxide hard mask layer 140' as shown in FIG. 3B. In another preferred embodiment as shown in FIG. 3C, a polysilicon field plate 150 covered with oxide layer 155 is formed over the field oxide layer 140.

Figure 4A:
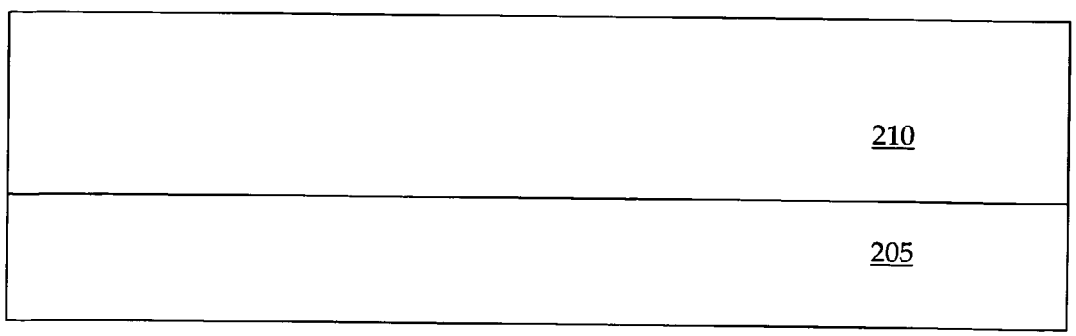
FIGS. 4A to 4J are serial cross sectional views for describing the manufacturing processes to fabricate a BAS diode device of this invention.
Figure 4B:
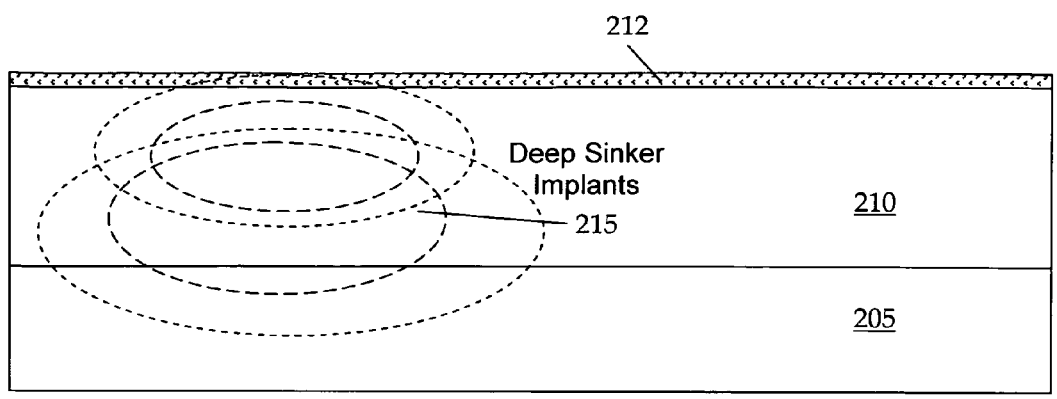
Figure 4C:
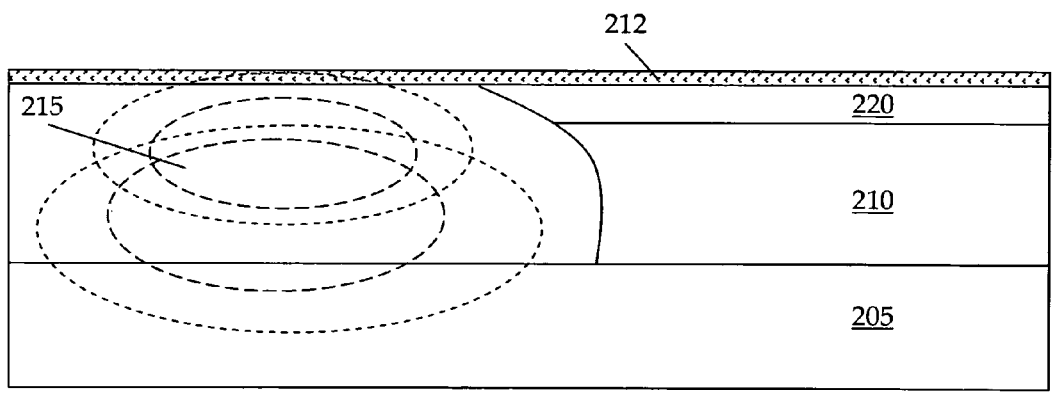
Figure 4D:
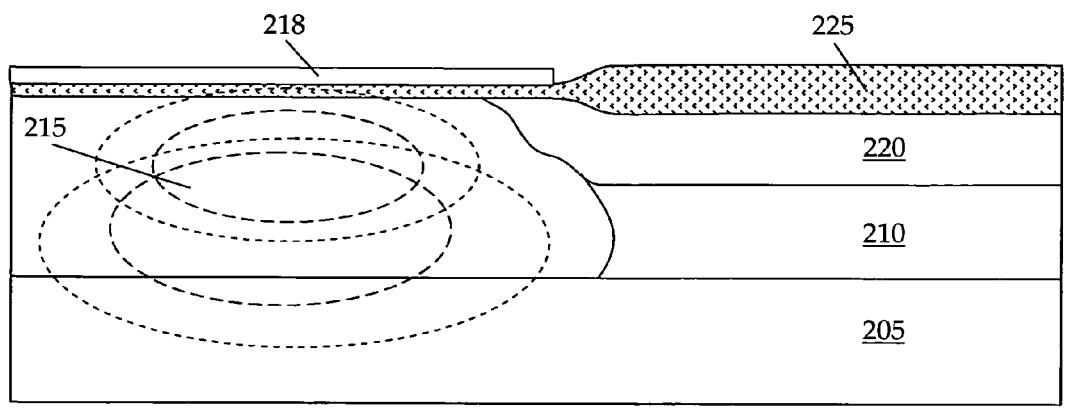

Referring to FIGS. 4A to 4J for a serial of side cross sectional views to illustrate the fabrication steps of a BAS diode device as that shown in FIG. 2. In FIG. 4A, a starting silicon substrate that includes a P++ substrate 205 doped with Boron with a resistivity of 3 to 5 mOhm-cm or a lower resistivity. The substrate 205 is preferably along a crystal-orientation of <100> as a standard prime. A P− epitaxial layer 210 supported on the substrate 205 with a thickness ranging from 2 to 7 micrometers typically doped with a low dosage of 5E14 to 5E15 for 20-60 volts applications. In FIG. 4B, a pad oxide layer 212 is grown. A thick resist sinker mask (not shown) is applied as a first mask to carry out deep sinker multiple energy implantations with an implanting dosage ranging from 1E14 to 5E15 at energy of 180-360 keV. Additional sinker implants are performed with higher energy levels of 450-800 keV and 800-1000 keV with an implanting dose in the range of 1E13 to 5E14 for example to form the P+sinker region 215. Formation of P+ sinker region 215 by multiple energy implantations minimizes lateral diffusion, thereby reducing the pitch size. Also, the deeper the implant, the higher the lateral straggle and distribution of the implant, to achieve the shielding under the Schottky contact. The implantation energy depends on the device's required breakdown voltage, which is a function of the epi thickness since there is a need to try to maximize the doping in the anode sinker contact region, away from the Schottky contact, to minimize the sinker resistance. Then the resist (not shown) is stripped followed by a sinker drive to thermally diffuse the sinker region 215. In FIG. 4C, a blanket N-cathode surface implant with arsenic or phosphorous ions is performed at a dose ranging from 5E11 to 1E13 depending on the breakdown voltage and the thermal budge. In FIG. 4D, a nitride layer 218 deposition is carried out to protect the N-cathode region 220 followed by applying an active mask to carry out a nitride etch. A self-aligned N-drift implant is carried out optionally, to optimize the dopant of cathode region 220 for reducing resistance without lowering breakdown voltage. The photo resist (not shown) is stripped and a field oxidation by applying a LOCOS process is carried out to form the field oxide layer 225. The oxidation LOCOS process can be optionally applied to diffuse the N-cathode region 220. The field oxide layer 225 may be grown to be approximately 0.3 to 1.00 □m thick—preferably about 0.5 □m at a temperature of 900 to 1100° C.

Figure 4E:
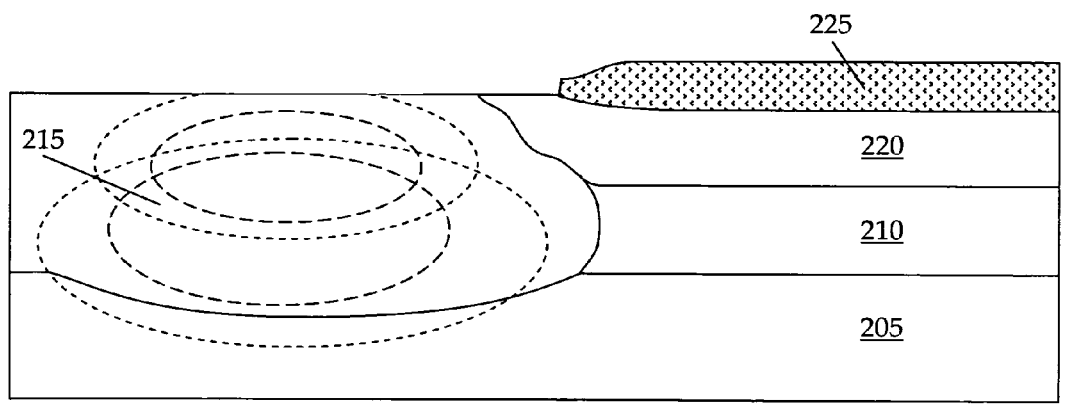
Figure 4F:
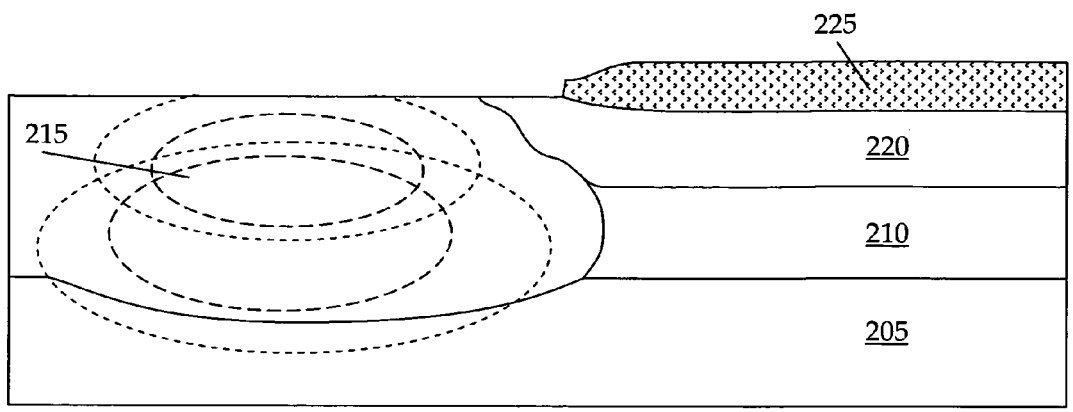
Figure 4G:
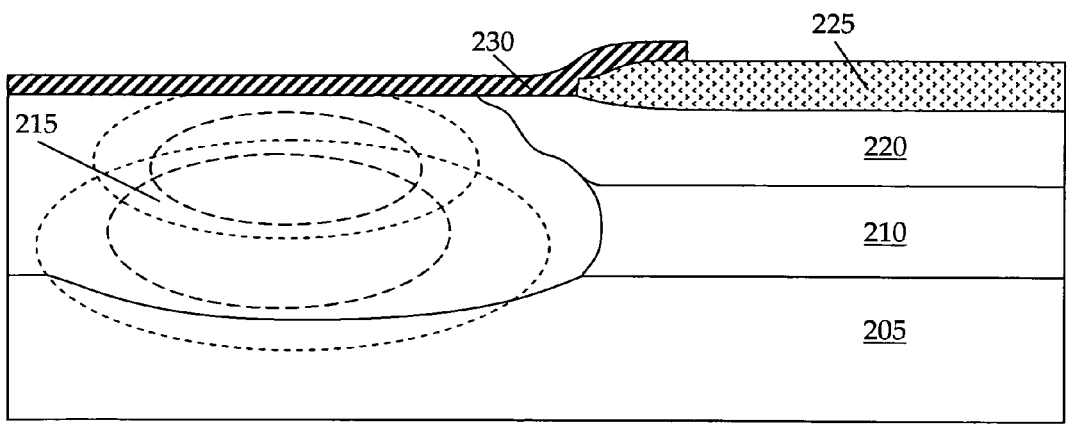
Figure 4H:
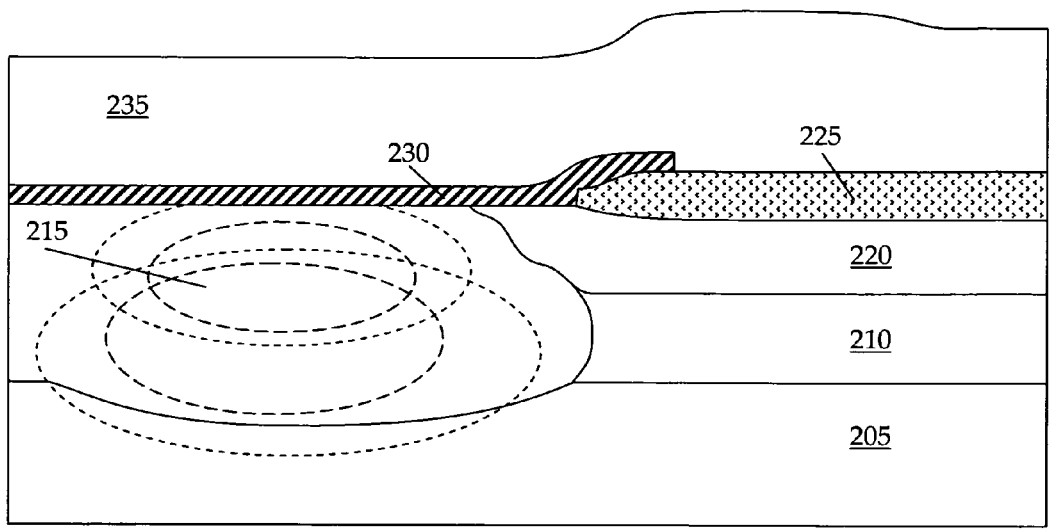
Figure 4I:
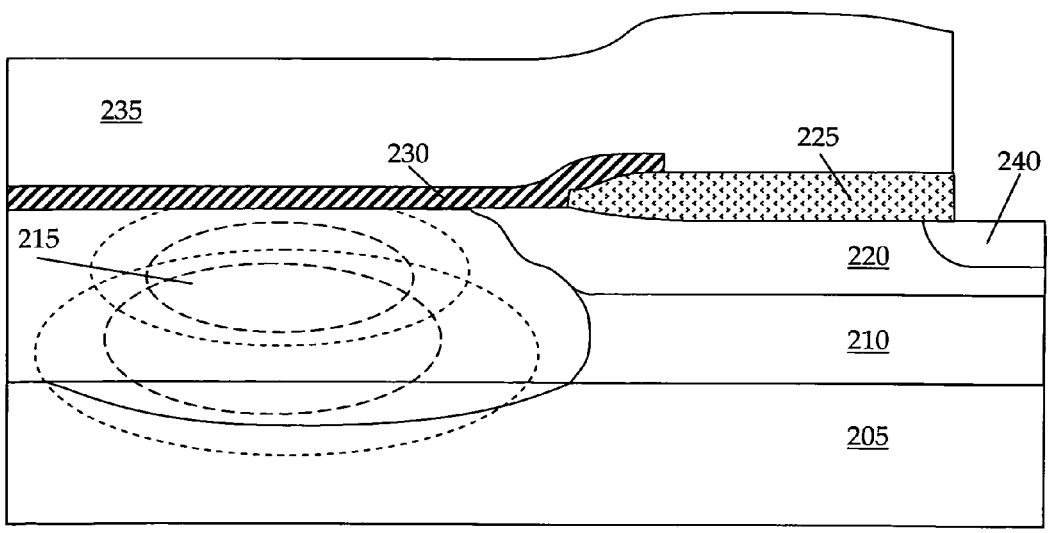
Figure 4J:
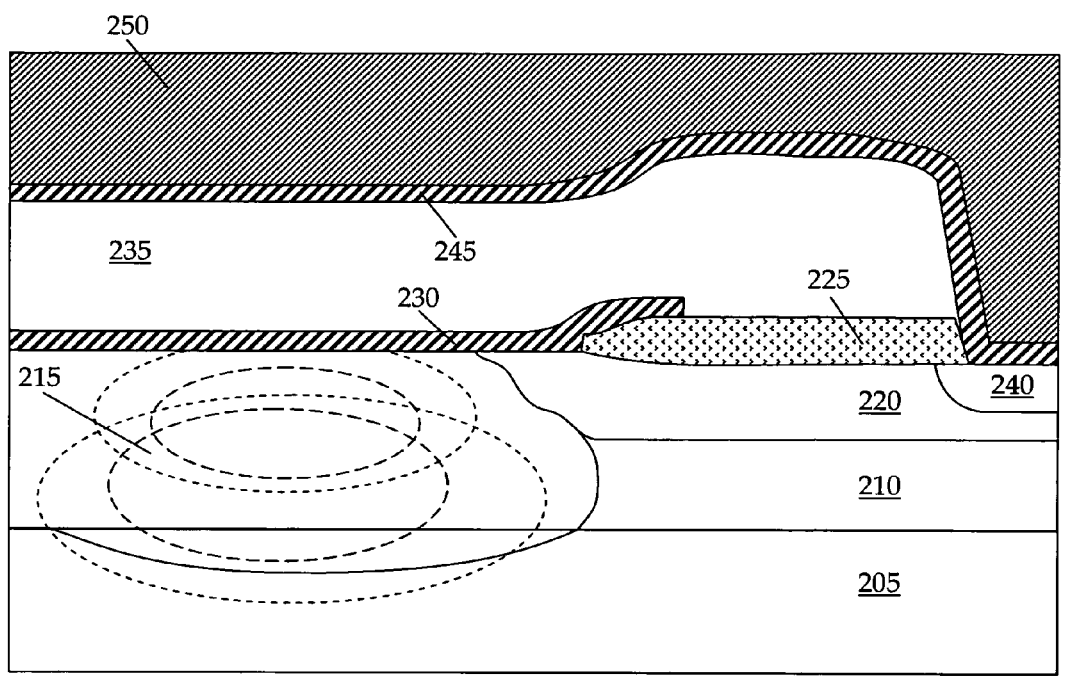

In FIG. 4E, the nitride 218 is stripped followed by an optional sacrificial layer growth (228) and strip. An optional gate oxide layer (not shown) is grown (if there is also a transistor on the die). In FIG. 4F, a short oxide etch is performed to remove the gate oxide layer to clear the active area. In FIG. 4G, an Schottky metal layer 230 is deposited. The Schottky metal layer may compose of Ti, Co, Ta, etc. A rapid thermal anneal process (RTP) is carried out at 600-800° C. in an $N_2$ chamber for 20-60 seconds. An Schottky metal patterning process is performed with an Schottky metal mask to etch a portion of the Schottky metal 230 followed by stripping the resist (not shown). In FIG. 4H a passivation layer 235 composed of BPSG or USG is deposited followed by a BPSG reflow process. In FIG. 4I, a contact mask (not shown) is applied to etch a contact opening through the passivation layer 235 and field oxide layer 225 followed by a contact implant to form a cathode contact region 240. An optional anneal can be performed prior to metal deposition, for example, an RTP step in the 800-900 C range, in N2, for 10 to 60 seconds. In FIG. 4J, a cathode metallization process is performed to form cathode metal with options of the barrier metal layer 245 and/or Tungsten plug (not shown). An aluminum layer 250 is formed as the cathode metal over the top surface. A passivation layer (not shown) may be formed to protect the device.

Figure 5A:
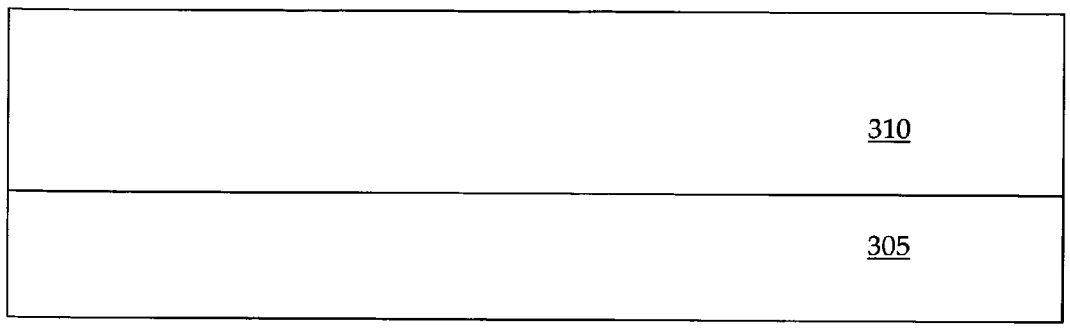
FIGS. 5A to 5L are serial cross sectional views for describing the manufacturing processes to fabricate another BAS diode device of this invention.
Figure 5B:
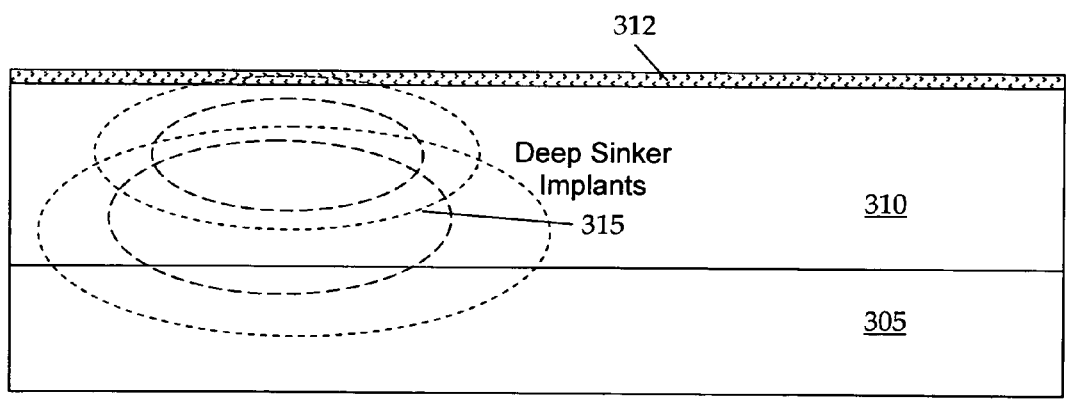
Figure 5C:
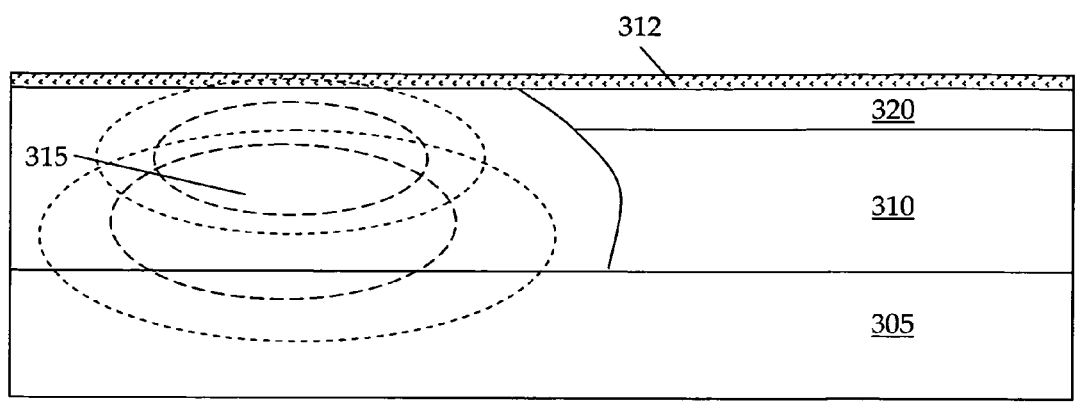
Figure 5D:
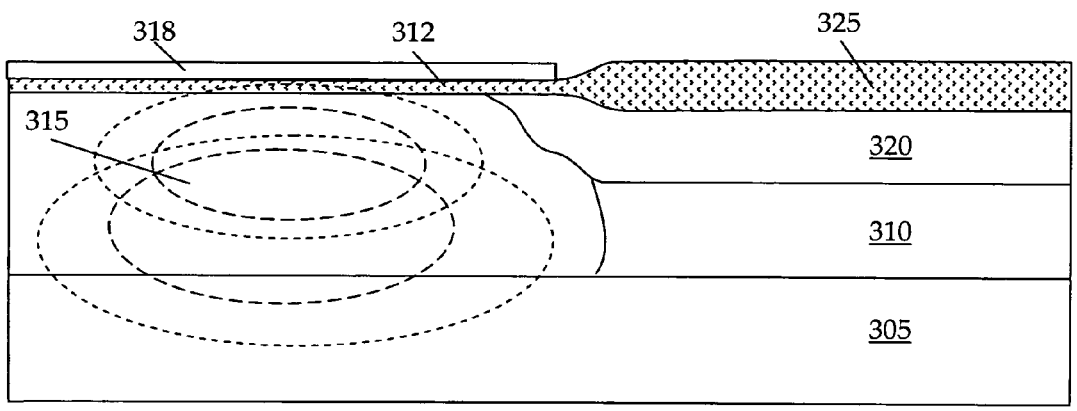

Referring to FIGS. 5A to 5J for a serial of side cross sectional views to illustrate and alternate set of fabrication steps of a BAS diode device as that shown in FIG. 3. In FIG. 5A, a starting silicon substrate that includes a P++ substrate 305 doped with Boron with a resistivity of 3 to 5 mOhm-cm or a lower resistivity. The substrate 305 is preferably along a <100>-crystal orientation as a standard prime. A P− epitaxial layer 310 supported on the substrate 305 with a thickness ranging from 2 to 7 micrometers typically doped with a low dosage of 5E14 to 5E15 for 20-60 volts applications. In FIG. 5B, a pad oxide layer 312 is grown. A thick resist sinker mask (not shown) is applied as a first mask to carry out deep sinker multiple energy implantations with an implanting dosage ranging from 1E14 to 5E15 at energy of 180-360 keV. Additional sinker implants are performed with higher energy levels of 450-800 keV and 800-1000 keV with an implanting dose of 1E14 to form the sinker P+ sinker region 315. Formation of P+ sinker region 315 by multiple energy implantations minimizes lateral diffusion thereby reducing the pitch size. The implantation energy depends on the device's required breakdown voltage, which is a function of the EPI thickness. Then the resist (not shown) is stripped followed by a sinker drive to thermally diffuse the sinker region 315. In FIG. 5C, a blanket N-cathode surface implant with arsenic or phosphorous ions is performed at a dose ranging from 5E11 to 1E13 depending on the breakdown voltage and the thermal budget. In FIG. 5D, a nitride deposition is carried out to protect the N-cathode region 320 followed by applying an active mask to carry out a nitride etch. A self-aligned N-drift implant is carried out optionally to optimize cathode region 320. The photo resist (not shown) is stripped and a field oxidation by applying a LOCOS process is carried out to form the field oxide layer 325. The oxidation LOCOS process can be optionally applied to diffuse the N-cathode region 320. The field oxide layer 225 may be grown to be approximately 0.3 to 1.0 □m thick—preferably about 0.5 □m at a temperature of 900 to 1050° C.

Figure 5E:
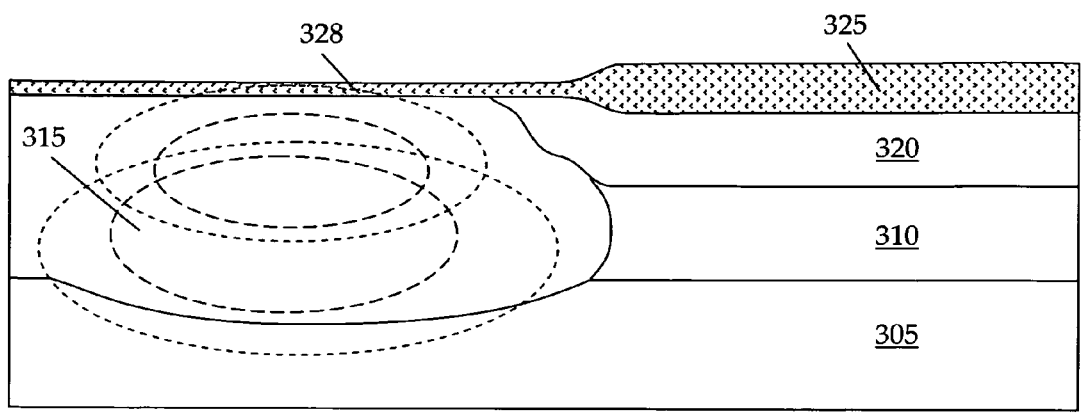
Figure 5F:
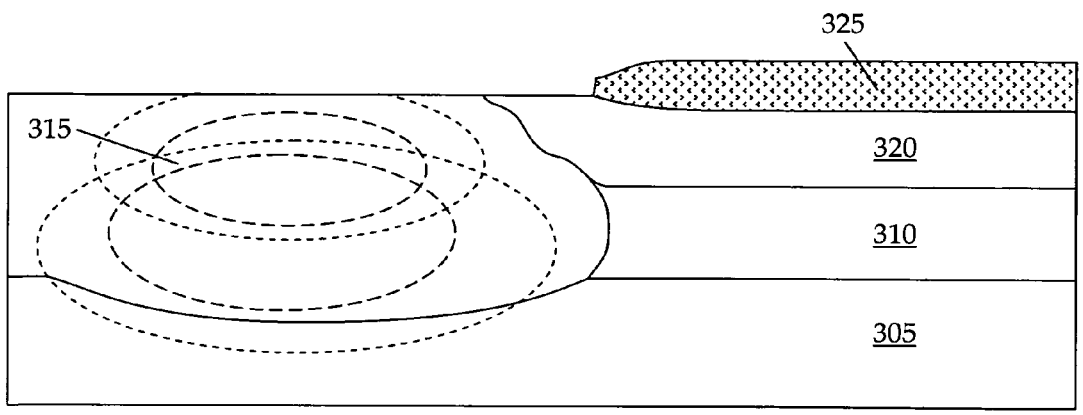
Figure 5G:
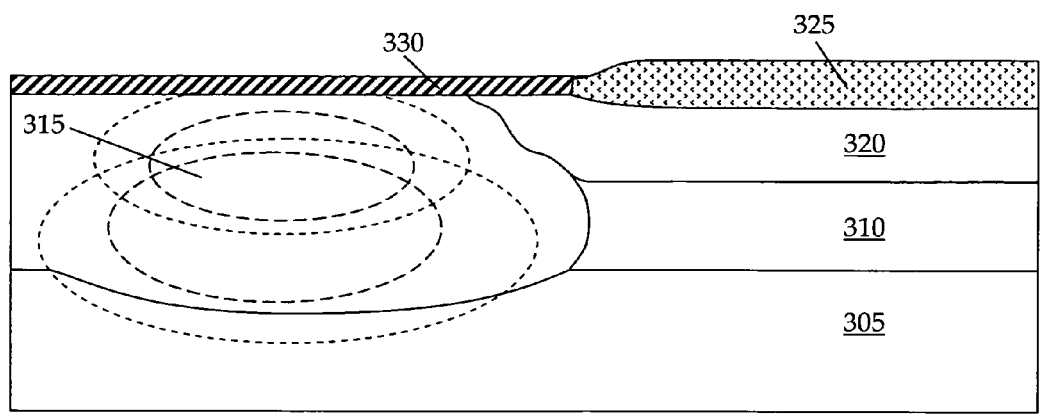
Figure 5H:
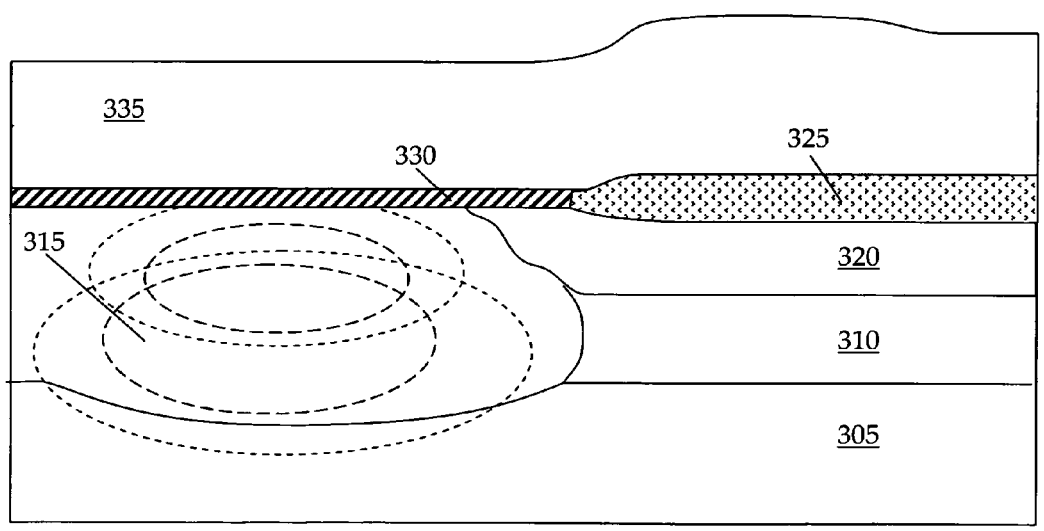
Figure 5I:
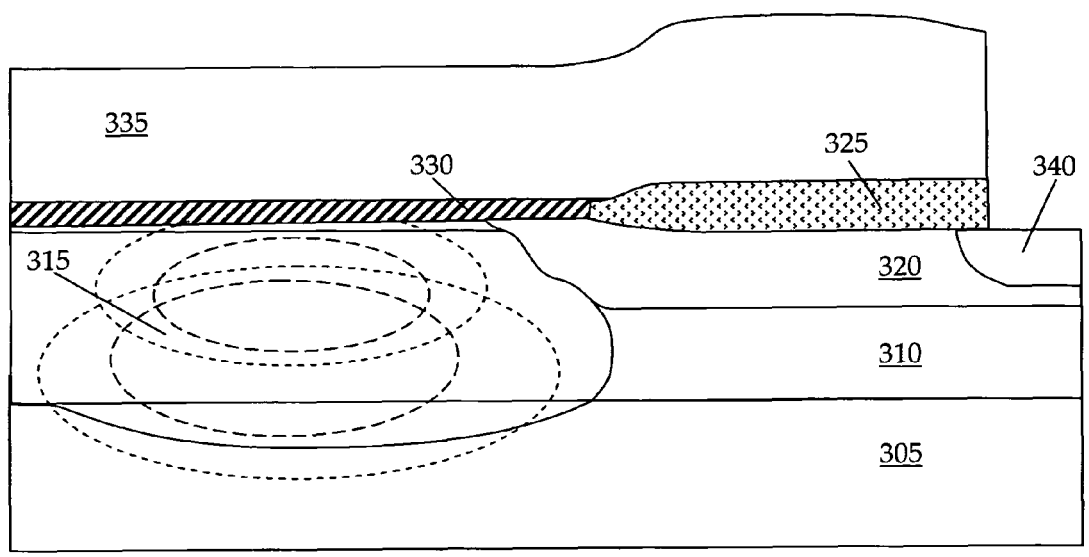
Figure 5J:
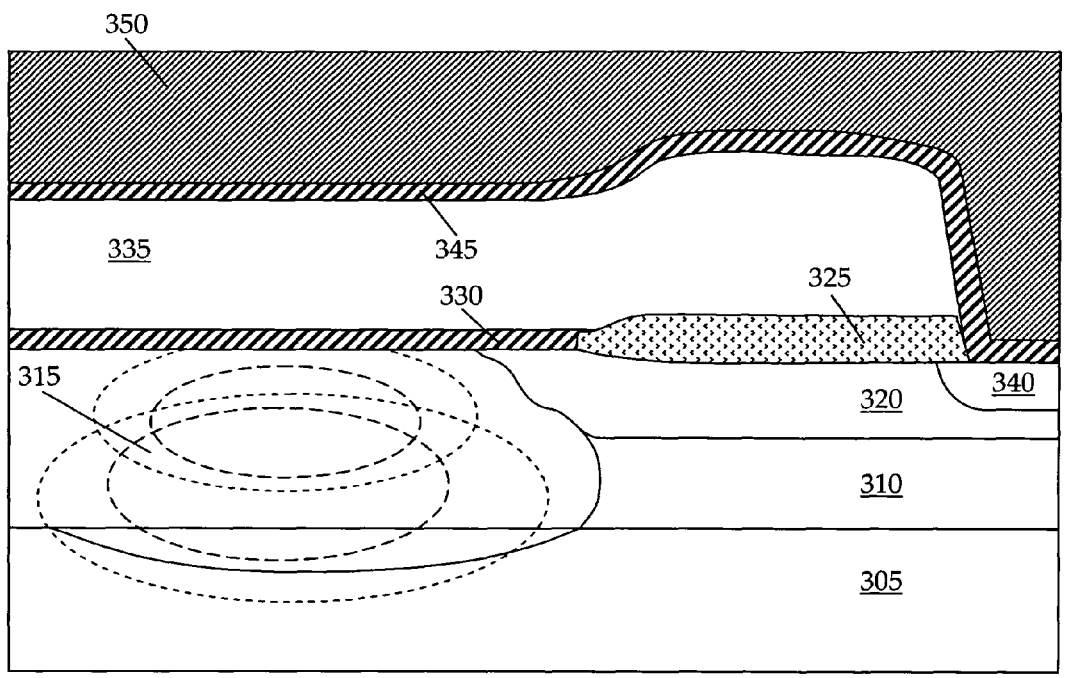
Figure 5K:
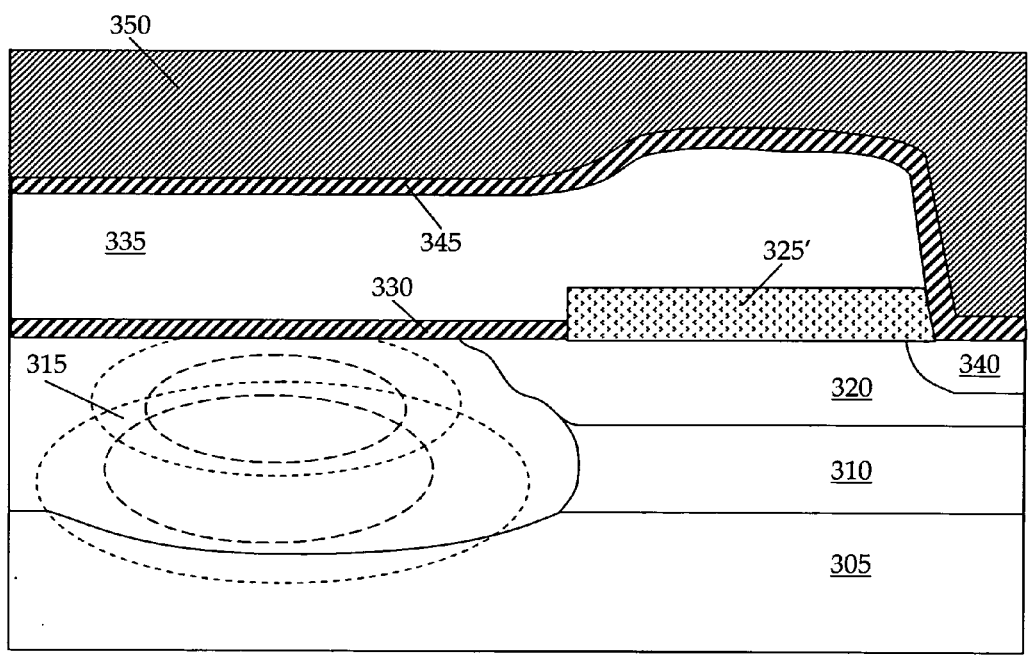
Figure 5L:
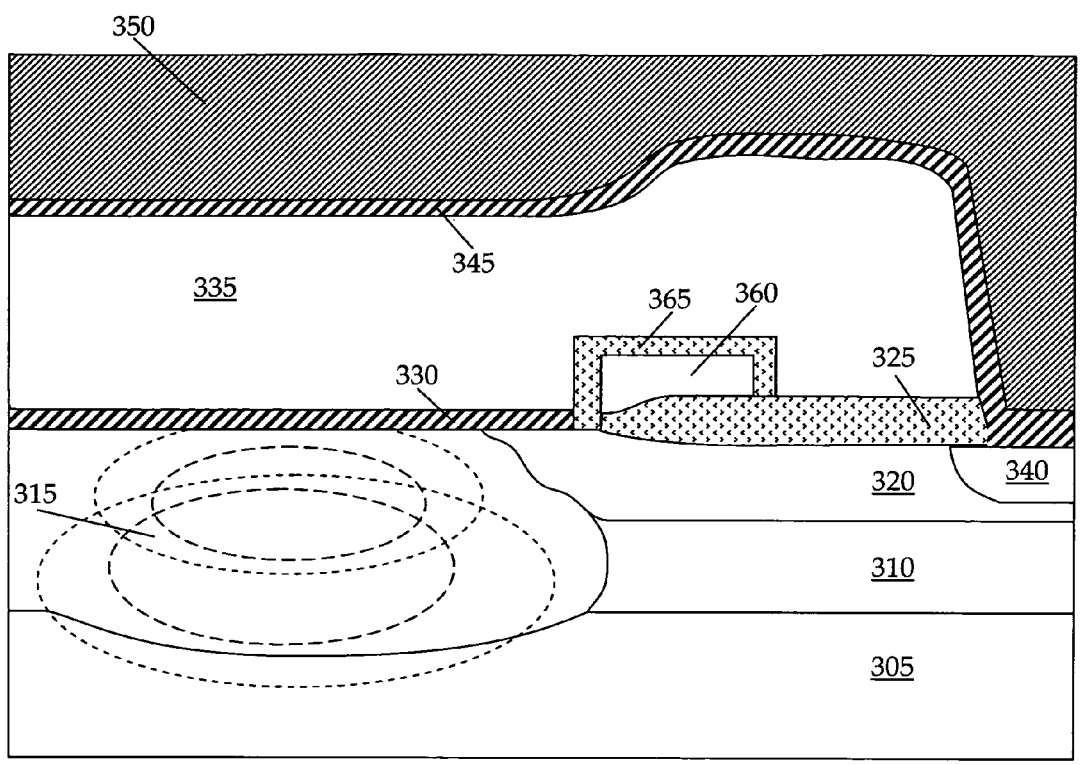

In FIG. 5E, the pad oxide 312 is stripped followed by an optional sacrificial layer growth (328) and strip. An optional gate oxide layer (not shown) is grown followed by depositing a polysilicon layer or preferably a polycide layer having a thickness up to 2000 Angstroms (not shown). In FIG. 5F, a short oxide etch is performed to remove the gate oxide layer to clear the active area. In FIG. 5G, an Schottky metal layer 330 is deposited. The Schottky metal layer may compose of Ti, Co, Ta, W, Mo, etc. A rapid thermal anneal process (RTP) is carried out at 600-800° C. in $N_2$ chamber for 20-60 seconds. A Schottky metal patterning process is performed with a salicide (self-aligned silicide) etch to remove the portions of the Schottky metal layer 330 which did not react with underlying silicon to form silicide, thus forming a self-aligned anode to substrate connection adjacent to a Schottky contact. The etch process can be a wet etch, using ammonium hydroxide, peroxide and water solution for example. Following the Salicide etch process, an optional RTP in the 800-900 C range, in N2, for 10 to 60 seconds, may be applied. In FIG. 5H a passivation layer 335 composed of BPSG or USG is deposited followed by a BPSG reflow process. In FIG. 5I, a contact mask (not shown) is applied to etch a contact opening through the passivation layer 335 and the field oxide layer 325 followed by a contact implant to form a cathode contact region 340. An RTP anneal to activate the contact implant can also be used. In FIG. 5J, a cathode metallization process is performed to form the cathode metal with options of barrier metal layer 345 and or Tungsten plug (not shown). Then an aluminum layer 350 is formed as the cathode metal over the top surface. A passivation layer (not shown) is formed to protect the device. FIG. 5K shows an alternate embodiment of the device that the field oxide 325 is replaced by a pad oxide where the process of growing field oxide in FIG. 5D is replaced by LPV deposition then patterned. FIG. 5L shows another embodiment with a polysilicon field plate 360 formed before Schottky metal layer 330 is deposited. A polysilicon layer 360 is deposited and pattern with a mask then oxidized to form the field plate 360 with oxide layer 365. The device then continues the rest of process to form a Schottky diode with a floating polysilicon field piate that improves the breakdown of device.

According to above processing steps for manufacturing the bottom anode Schottky diodes, various design parameters may be adjusted for different applications with optimal performances. The width of the top contact to the P+ anode-sinker may be minimized to achieve a benefit of reducing the cell pitch. The width of the top surface overlapping the N-cathode region for Schottky contact may be maximized to achieve a benefit of maximizing Schottky contact to reduce resistance and increase current handling capability. The depth and lateral diffusion under the N-cathode region of the deep anode-sinker region may be maximized and The doping concentration of the N-cathode and the overlapping deep anode sinker region may be optimized to maximize the pinch off at a high voltage but with a maximized Schottky contact region defined by the overlap of the Schottky metal and the N-region.

By adjusting various design parameters as described above, further analyses confirm that the BAS diode devices according to the disclosures made in this invention can achieve a cell pitch in a range of approximately 7 □m for applying to device operated at 35-45 volts and about 9 □m for a device operated around 45-65 volts. A high breakdown voltage is achievable even if a quasi-vertical structure is implemented with a portion of the current-flow path is along a lateral direction. Specifically, a breakdown voltage in the range of 40-65 volts is achievable at a current of approximately 10 □A and at room temperature. Higher breakdown voltage is achievable with higher anode-sinker doping concentration or with a lower N-cathode blank implant dosage that confirms a pinch off function takes place in the deeper anode-sinker region. A low forward voltage is achievable. Specifically, the forward voltage is approximately 0.7 volts at 100 A/cm$^2$, i.e., 1 A in an area of 1.0 mm$^2$ in the active area and the forward voltage is approximately 1.1 volts at 1000 A/cm$^2$, i.e., 10 A in an area of 1.0 mm$^2$ in the active area. Compared with a silicon control diode, the forward voltages resulting from these analyses confirm that the bottom-diode structure is indeed functioning as a true Schottky diode.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

What is claimed is:

1. A method for manufacturing a quasi-vertical diode on a semiconductor substrate comprising a top and a bottom electrodes comprising:
    forming a laterally extended doped region in said semiconductor substrate to function as a lateral current-path region for conducting a current between said top and bottom electrodes of said diode; and,
    forming a sinker doped region at a depth in said semiconductor substrate, interfacing with said lateral path region to extend vertically to a one of said top or bottom surface of said diode to function as a vertical current path.

2. The method of claim 1 further comprising:
    electrically connecting said lateral current path region to one of said top or bottom electrodes.

3. A method of claim 1 for manufacturing a quasi-vertical diode on a semiconductor substrate comprising a top and a bottom electrodes comprising:
    forming a laterally extended doped region in said semiconductor substrate to function as a lateral current-path region for conducting a current between said top and bottom electrodes of said diode; and
    forming a sinker doped region as a vertical current path extending to said bottom electrode, and said step of forming said lateral current path region further comprising a step of connecting said laterally current path region to said top electrode.

4. The method of claim 1 wherein:
    said method of manufacturing said quasi-vertical diode further comprising a step of manufacturing a bottom-anode Schottky (BAS) diode by forming said bottom electrode as a bottom anode electrode.

5. The method of claim 3 wherein:
    said method of manufacturing said quasi-vertical diode further comprising a step of manufacturing a bottom-anode Schottky (BAS) diode by forming said bottom electrode as a bottom anode electrode.

* * * * *